US011482575B2

(12) United States Patent
Zhou et al.

(10) Patent No.: US 11,482,575 B2
(45) Date of Patent: Oct. 25, 2022

(54) DISPLAY PANEL AND DISPLAY DEVICE

(71) Applicants: WUHAN TIANMA MICRO-ELECTRONICS CO., LTD., Wuhan (CN); WUHAN TIANMA MICROELECTRONICS CO., LTD. SHANGHAI BRANCH, Shanghai (CN)

(72) Inventors: Jingxiong Zhou, Wuhan (CN); Ruiyuan Zhou, Wuhan (CN); Duzen Peng, Shanghai (CN)

(73) Assignee: Shanghai Tianma AM-OLED Co., Ltd., Shanghai (CN)

( * ) Notice: Subject to any disclaimer, the term of this patent is extended or adjusted under 35 U.S.C. 154(b) by 0 days.

(21) Appl. No.: 16/916,590

(22) Filed: Jun. 30, 2020

(65) Prior Publication Data

US 2021/0313402 A1    Oct. 7, 2021

(30) Foreign Application Priority Data

Apr. 3, 2020   (CN) .......................... 202010258826.3

(51) Int. Cl.
   *H01L 27/32*   (2006.01)
(52) U.S. Cl.
   CPC ...... *H01L 27/3218* (2013.01); *H01L 27/3216* (2013.01)
(58) Field of Classification Search
   CPC .... H01L 27/3206–3218; H01L 27/326; G09G 3/20
   See application file for complete search history.

(56) References Cited

U.S. PATENT DOCUMENTS

2018/0350888 A1*  12/2018  Huo ................. H01L 51/0005
2020/0402442 A1*  12/2020  Liu ..................... H01L 27/32
(Continued)

FOREIGN PATENT DOCUMENTS

CN    108807491 A    11/2018
CN    110620135 A  * 12/2019  ............ H01L 27/32
(Continued)

OTHER PUBLICATIONS

First Chinese Office Action related to Application No. 202010258826.3 dated May 17, 2022.

*Primary Examiner* — Eric K Ashbahian
(74) *Attorney, Agent, or Firm* — von Briesen & Roper, s.c.

(57) ABSTRACT

Provided are a display panel and a display device. The display panel includes pixel unit groups arranged in a matrix, where a row direction of the matrix is a first direction; in a same pixel unit group, geometric centers of two first sub-pixels and geometric centers of two second sub-pixels form a first virtual parallelogram, where the first virtual parallelogram includes two first sides extending along the first direction and two second sides extending along a second direction, and the second direction intersects and is not perpendicular to the first direction; a geometric center of one third sub-pixel is located inside the first virtual parallelogram, the other three third sub-pixels are located outside the first virtual parallelogram, and geometric centers of the four third sub-pixels form a second virtual parallelogram, where the second virtual parallelogram includes two third sides extending along the first direction, and two fourth sides extending along the second direction.

16 Claims, 11 Drawing Sheets

(56) References Cited

U.S. PATENT DOCUMENTS

| | | | |
|---|---|---|---|
| 2021/0098539 A1* | 4/2021 | Zhang | H01L 27/3216 |
| 2021/0098540 A1* | 4/2021 | Chen | H01L 27/326 |
| 2021/0257435 A1* | 8/2021 | Kim | H01L 27/3276 |

FOREIGN PATENT DOCUMENTS

| | | |
|---|---|---|
| CN | 110620135 A | 12/2019 |
| CN | 110767733 A | 2/2020 |

* cited by examiner

DISPLAY PANEL AND DISPLAY DEVICE

CROSS-REFERENCE TO RELATED APPLICATIONS

This application claims priority to Chinese patent application No. CN202010258826.3 filed with CNIPA on Apr. 3, 2020, the disclosure of which is incorporated herein by reference in its entirety.

TECHNICAL FIELD

The present disclosure relates to the field of display technologies, and particularly to a display panel and a display device.

BACKGROUND

With the continuous development of display technologies, users have higher and higher requirements on display effects of display devices, but most display devices in the related art do not display well. Specifically, diagonal aliasing in a displayed picture and uneven color mixing of adjacent, different-colored sub-pixels are relatively prominent, resulting in a poor display effect of the display panel.

SUMMARY

The present disclosure provides a display panel and a display device to improve a display effect of the display panel.

In a first aspect, an embodiment of the present disclosure provides a display panel, including multiple pixel unit groups arranged in a matrix, where a row direction of the matrix is a first direction.

The pixel unit group includes two first sub-pixels, two second sub-pixels and four third sub-pixels, and the first sub-pixel, the second sub-pixel and the third sub-pixel emit light of different colors.

In a same pixel unit group, geometric centers of two first sub-pixels and geometric centers of two second sub-pixels form a first virtual parallelogram, where the first virtual parallelogram includes two first sides extending along the first direction and two second sides extending along a second direction, and the second direction intersects and is not perpendicular to the first direction.

A geometric center of one third sub-pixel is located inside the first virtual parallelogram, the other three third sub-pixels are located outside the first virtual parallelogram, and geometric centers of the four third sub-pixels form a second virtual parallelogram, where the second virtual parallelogram includes two third sides extending along the first direction, and two fourth sides extending along the second direction.

In a second aspect, embodiments of the present disclosure further provide a display device including the display panel described in the first aspect.

BRIEF DESCRIPTION OF DRAWINGS

Other features, objects and advantages of the present disclosure will become more apparent from a detailed description of non-restrictive embodiments with reference to the following drawings.

DETAILED DESCRIPTION

Figure 1:
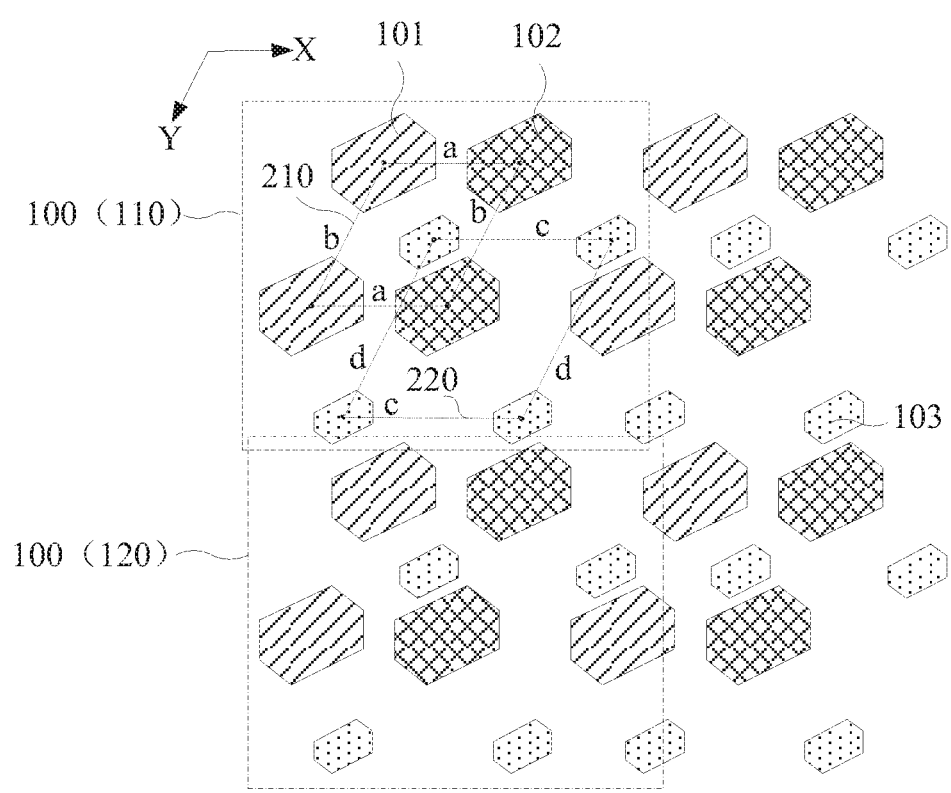
FIG. 1 is a structural diagram of a display panel according to an embodiment of the present disclosure.

To further elucidate technical means and technical effects for achieving an intended purpose of the present disclosure, the specific embodiments, structures, features and effects of a display panel and a display device according to the present disclosure will be described hereinafter in detail with reference to the accompanying drawings and embodiments.

Embodiments of the present disclosure provide a display panel, including multiple pixel unit groups arranged in a matrix, where a row direction of the matrix is a first direction.

The pixel unit group includes two first sub-pixels, two second sub-pixels and four third sub-pixels, and the first sub-pixel, the second sub-pixel and the third sub-pixel emit light of different colors.

In a same pixel unit group, geometric centers of two first sub-pixels and geometric centers of two second sub-pixels form a first virtual parallelogram, where the first virtual parallelogram includes two first sides extending along the first direction and two second sides extending along a second direction, and the second direction intersects and is not perpendicular to the first direction.

A geometric center of a third sub-pixel is located inside the first virtual parallelogram, the other three third sub-pixels are located outside the first virtual parallelogram, and geometric centers of the four third sub-pixels form a second virtual parallelogram, where the second virtual parallelogram includes two third sides extending along the first direction, and two fourth sides extending along the second direction.

According to the present disclosure, in the pixel unit group, geometric centers of two first sub-pixels and geometric centers of two second sub-pixels form the first virtual parallelogram, the geometric center of one third sub-pixel is located inside the first virtual parallelogram, the other three third sub-pixels are located outside the first virtual parallelogram, and geometric centers of the four third sub-pixels form the second virtual parallelogram. The first virtual parallelogram includes two first sides extending along the first direction and two second sides extending along the second direction, and the second direction intersects and is not perpendicular to the first direction. The second virtual parallelogram includes two third sides extending along the first direction, and two fourth sides extending along the second direction. The distances from any third sub-pixel to the other three third sub-pixels on the shorter diagonal of the second virtual parallelogram are close, so that the third sub-pixels are uniformly distributed, and further, when the third sub-pixels are used as the visual center sub-pixels, the image displayed by the display panel is finer and smoother. On the other hand, geometric centers of the third sub-pixels arranged in an oblique direction are located near or on a same oblique line, so that a better display effect of an oblique line can be achieved based on the third sub-pixels. In the pixel unit group, the first sub-pixel, the second sub-pixel and the third sub-pixel are adjacently disposed, their geometric centers are disposed on three vertices of a same triangle, and the distance between the third sub-pixel and first sub-pixel and the distance between the third sub-pixel and the second sub-pixel are close, which is beneficial to the color mixing of light of different colors emitted by the three sub-pixels, reduces the probability of a color cast phenomenon in the pixel unit group, and improves the display effect of the display panel.

The above-mentioned is the core idea of the present application. It should be apparent that the embodiments described below are part, not all, of the embodiments of the present disclosure. Based on embodiments of the present disclosure, all other embodiments obtained by those skilled in the art without making creative work are within the scope of the present disclosure.

Details are set forth below to facilitate a thorough understanding of the present disclosure. However, the present disclosure may be implemented by other embodiments different from the embodiments described herein, and those skilled in the art may make similar generalizations without departing from the spirit of the present disclosure. Therefore, the disclosure is not limited to the specific embodiments described below.

In addition, the present disclosure will be described in detail in conjunction with the drawings. In the detailed description of embodiments of the present disclosure, for ease of description, schematic diagrams illustrating structures of devices and components are not partially enlarged in accordance with a general proportional scale. The schematic diagrams are merely illustrative and are not intended to limit the scope of the present disclosure. In addition, three-dimensional spatial sizes including length, width and height should be considered based on practical manufacturing contexts.

FIG. 1 is a structural diagram of a display panel according to an embodiment of the present invention. As shown in FIG. 1, the display panel includes multiple pixel unit groups 100 arranged in a matrix, where a row direction of the matrix is a first direction X. The pixel unit group 100 includes two first sub-pixels 101, two second sub-pixels 102 and four third sub-pixels 104, and the two first sub-pixels 101, the two second sub-pixels 102 and the four third sub-pixels 103 emit light of different colors. In a same pixel unit group 100, geometric centers of two first sub-pixels 101 and geometric centers of two second sub-pixels 102 form a first virtual parallelogram 210, where the first virtual parallelogram 210 includes two first sides a extending along the first direction X and two second sides b extending along a second direction Y, and the second direction Y intersects and is not perpendicular to the first direction X. A geometric center of a third sub-pixel 103 is located inside the first virtual parallelogram 210, the other three third sub-pixels 103 are located outside the first virtual parallelogram 210, and geometric centers of the four third sub-pixels 103 form a second virtual parallelogram 220, where the second virtual parallelogram 220 includes two third sides c extending along the first direction X, and two fourth sides d extending along the second direction Y.

Figure 2:
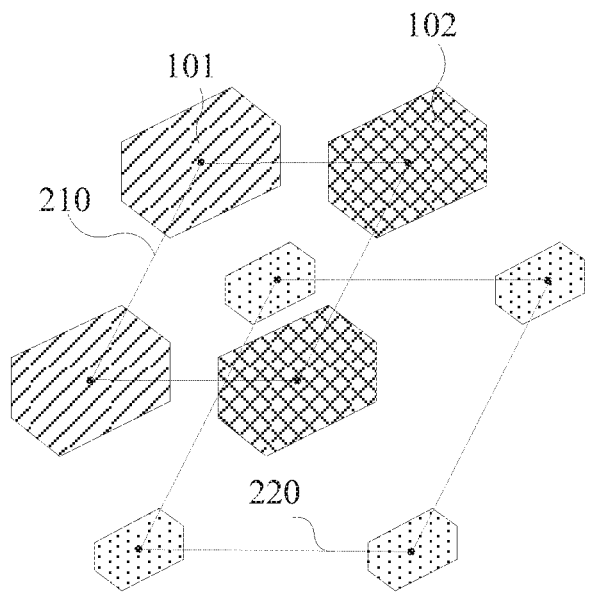
FIG. 2 is a structural diagram of a pixel unit group according to an embodiment of the present disclosure.
Figure 3:
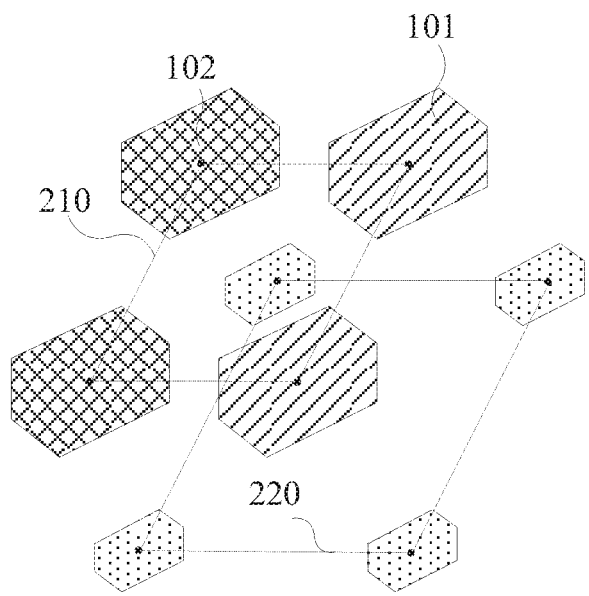
FIG. 3 is a structural diagram of another pixel unit group according to an embodiment of the present disclosure.
Figure 4:
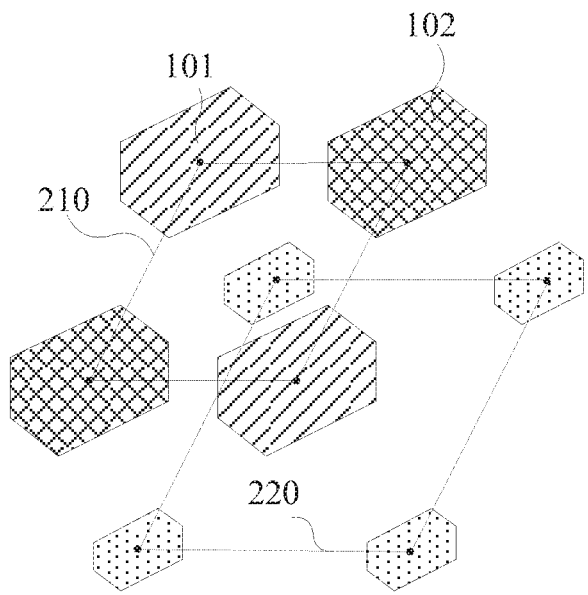
FIG. 4 is a structural diagram of another pixel unit group according to an embodiment of the present disclosure.
Figure 5:
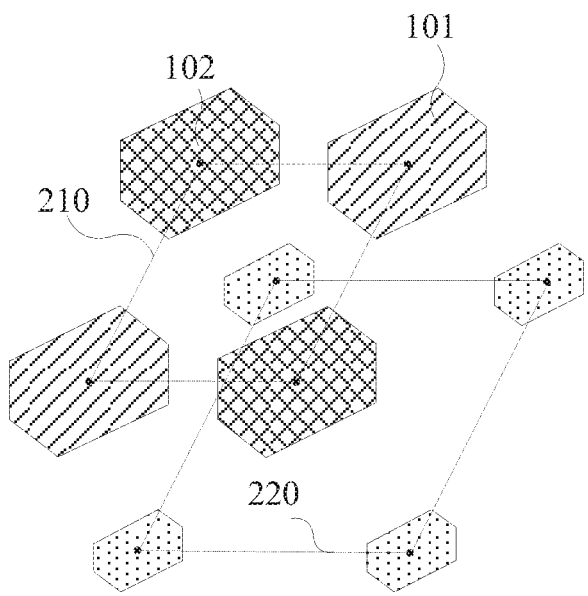
FIG. 5 is a structural diagram of another pixel unit group according to an embodiment of the present disclosure.
Figure 6:
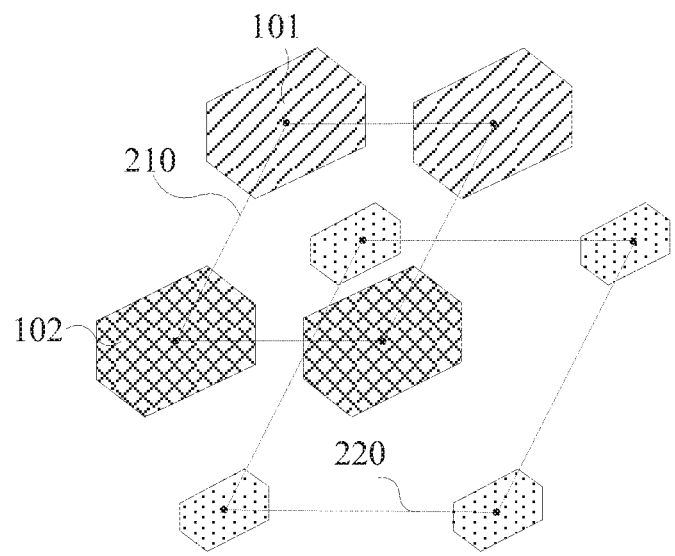
FIG. 6 is a structural diagram of another pixel unit group according to an embodiment of the present disclosure.
Figure 7:
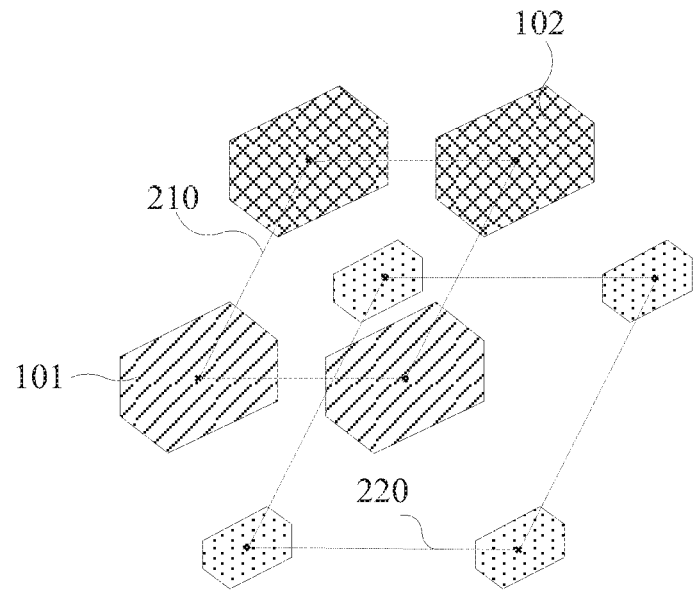
FIG. 7 is a structural diagram of another pixel unit group according to an embodiment of the present disclosure.

It should be noted that the structure of the pixel unit group 100 provided in this embodiment includes the following three types: in the first type, the two sub-pixels on the first side a emit light of different colors, and the two sub-pixels on the second side b emit light of a same color; in the second type, the two sub-pixels on the first side a emit light of different colors, and the two sub-pixels on the second side b emit light of different colors; and in the third type, the two sub-pixels on the first side a emit light of a same color, and the two sub-pixels on the second side b emit light of different colors. The structure of each type of pixel unit group 100 includes two specific structures according to the positions of the first sub-pixels 101 and the second sub-pixels 102. The structure of a pixel unit group 100 of the first type includes two specific structures as shown in FIG. 2 and FIG. 3, respectively; the structure of a pixel unit group 100 of the second type includes two specific structures as shown in FIG. 4 and FIG. 5, respectively; and the structure of a pixel unit group 100 of the third type includes two specific structures as shown in FIG. 6 and FIG. 7, respectively. The pixel unit group 100 in the same display panel includes at least one of the six specific structures, and when the display panel includes two or more specific structures, the positions of the pixel unit groups 100 having various specific structures are not limited, and can be reasonably set according to actual requirements. Exemplarily, FIG. 1 only shows that the pixel unit group 100 in the same display panel includes one specific structure.

In the conventional pixel arrangement in the related art, the geometric centers of four adjacent third sub-pixels 103 as the visual centers are generally arranged in a square, a distance between two third sub-pixels 103 located on any one side on the square is U, and the distance between two third sub-pixels 103 located on the diagonal of the square is √2U, so that the distances from any third sub-pixel 103 to the other three third sub-pixels 103 are not close, and the distance between the third sub-pixel 103 and one other third sub-pixel 103 in the other three third sub-pixels 103 is even larger, resulting in poor distribution uniformity of the third sub-pixels 103. In this embodiment, the geometric centers of the four third sub-pixels 103 as the visual centers are arranged in a parallelogram, so that the difference between the distance between two third sub-pixels 103 on the diagonal and the side length of the parallelogram is reduced, the distances from any third sub-pixel 103 on the shorter diagonal to the other three third sub-pixels 103 are closer, and the distribution uniformity of the third sub-pixels 103 is improved.

Tt should be noted that the second virtual parallelogram 220 is formed such that the geometric centers of the third sub-pixels 103 arranged in the oblique direction are located near a same oblique line or on the oblique line, and thus a better display effect of an oblique line can be achieved based on the third sub-pixels 103. Further, in the related art, a pixel rendering manner is often used to display at a high PPI with a low physical PPI. Specifically, a to-be-displayed picture is composed of multiple image pixel units, where the image pixel unit includes three sub-pixels emitting light of different colors, and the image pixel unit exemplarily includes a red sub-pixel, a green sub-pixel and a blue sub-pixel. In order to display the to-be-displayed picture on a display panel which has a physical PPI smaller than the PPI of the to-be-displayed picture, a part of sub-pixels in the display panel need to simultaneously display contents of sub-pixels with corresponding light-emitting colors in two image pixel units. That is, the part of sub-pixels belong to two display pixel units, where the display pixel units are used to display contents of image pixel units at the same position in the to-be-displayed picture, and the light-emitting colors of the three sub-pixels included in the display pixel unit are respectively the same as the light-emitting colors of the three sub-pixels in the image pixel unit. Theoretically, the first sub-pixel 101, the second sub-pixel 102, and the third sub-pixel 103, which are disposed adjacently at random and have geometric centers respectively located on three vertices of a same triangle, may form a display pixel unit, but generally, the sub-pixels used as the visual center belong to only one display pixel unit, so as to improve the display effect of the display panel by reasonably setting the position of the sub-pixels. Exemplarily, in this embodiment, the third sub-pixel 103 may be a sub-pixel used as the visual center. On the premise of setting the second virtual parallelogram 220, the first virtual parallelogram 210 is set, the first side of the first virtual parallelogram 210 is parallel to the third side of the second virtual parallelogram 220, and the second side of the first virtual parallelogram 210 is parallel to the fourth side of the second virtual parallelogram 220, so that in the pixel unit group, the distances from the geometric center of the third sub-pixel 103 in each display pixel unit to the geometric center of the first sub-pixel 101 and the geometric center of the second sub-pixel 102 are close, the sub-pixels emitting light of three different colors can implement color mixing to obtain target white light well, and the probability of a color cast phenomenon in the pixel unit group 100 is reduced.

It can be understood that, after the distance between the adjacent pixel unit groups 100 is reasonably adjusted, the distance from the third sub-pixel 103 to the first sub-pixel 101 and the second sub-pixel 102 in any display pixel unit in the display panel can be made to be close, so as to achieve a better display effect.

Exemplarily, with continued reference to FIG. 1, the multiple pixel unit groups 100 include multiple first pixel unit groups 110 and multiple second pixel unit groups 120, the multiple first pixel unit groups 110 are located in an odd row of the matrix and the multiple second pixel unit groups 120 are located in an even row of the matrix, and the first pixel unit group 110 and the second pixel unit group 120 have a same structure.

It should be noted that, in this arrangement, only the structure of one pixel unit group 100 needs to be designed as a repeating unit, and then multiple repeating units are arranged in a matrix, which is beneficial to reducing the difficulty in designing the previous pixel array structure.

Figure 8:
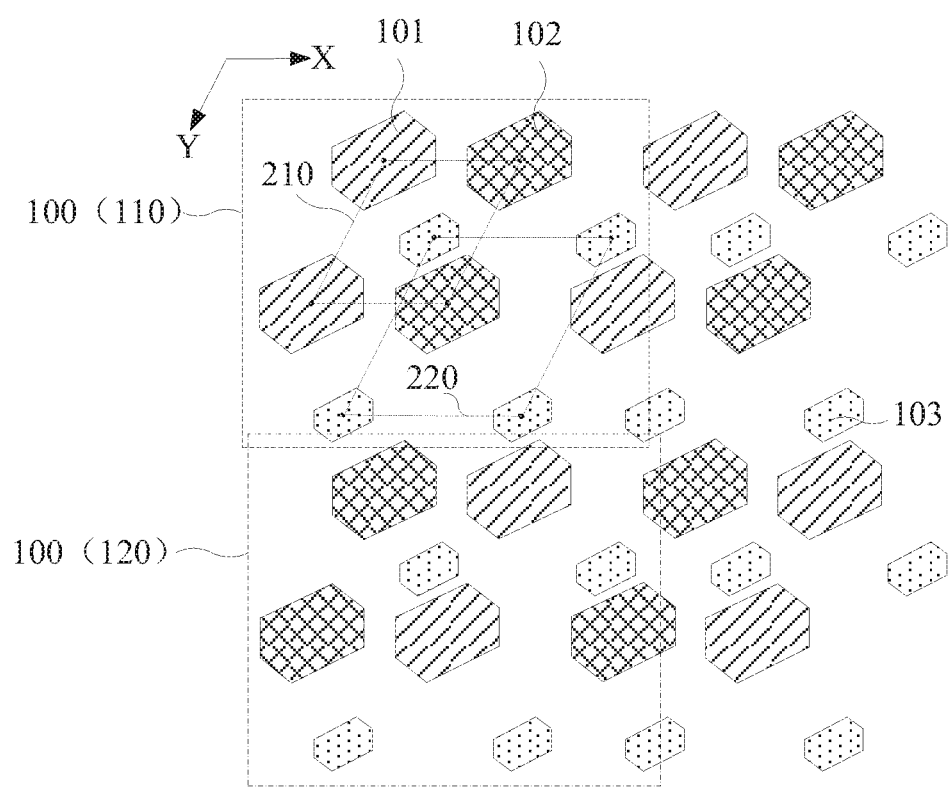
FIG. 8 is a structural diagram of another display panel according to an embodiment of the present disclosure.

FIG. 8 is a structural diagram of another display panel according to an embodiment of the present disclosure. Unlike FIG. 1, in FIG. 8, after positions of the first sub-pixels 101 and the second sub-pixels 102 in the first pixel unit group are interchanged, the first pixel unit group and the second pixel unit group have a same structure.

It should be noted that in the structure shown in FIG. 8, geometric centers of the sub-pixels emitting light of a same color are located near or on a same oblique line in an oblique direction, which is beneficial to the displaying of oblique lines in the display picture. If the first sub-pixel 101 and the second sub-pixel 102 have a same shape and size, the first sub-pixel 101 and the second sub-pixel 102 would have an exact same arrangement, and organic light-emitting functional layers of the first sub-pixel 101 and the second sub-pixel 102 can be prepared in different process steps by using a same mask, thereby reducing the manufacturing cost of the mask.

Figure 9:
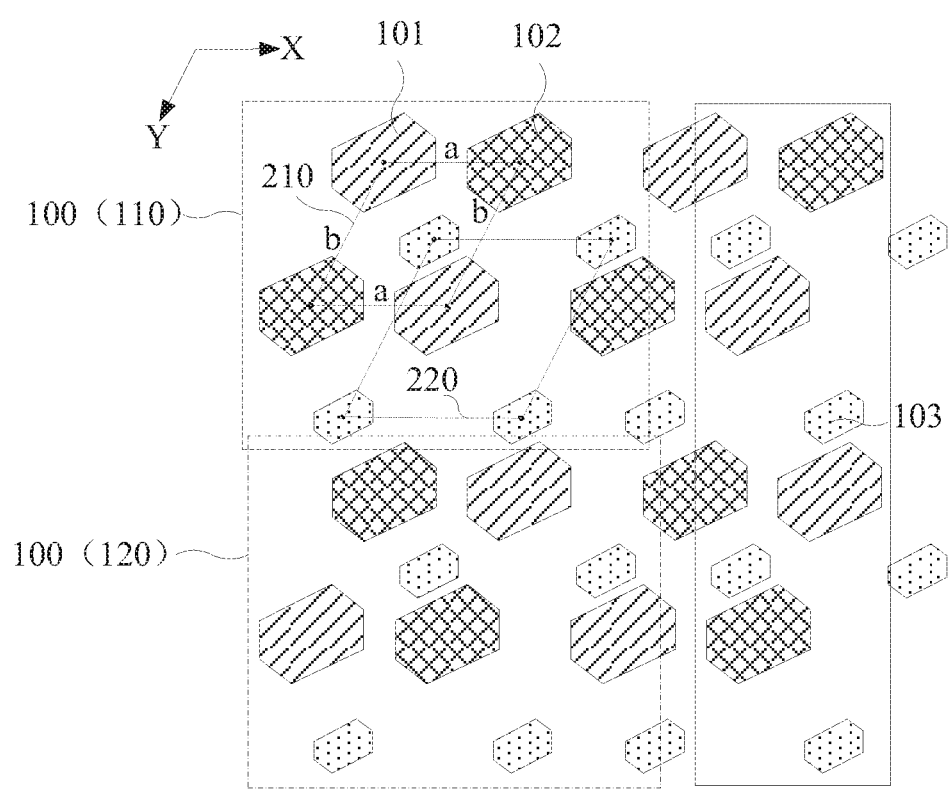
FIG. 9 is a structural diagram of another display panel according to an embodiment of the present disclosure.

FIG. 9 is a structural diagram of another display panel according to an embodiment of the present disclosure. On the basis of the embodiment shown in FIG. 8, in the display panel shown in FIG. 9, the two sub-pixels on the second side b of the first virtual parallelogram 210 emit light of different colors.

It should be noted that, the display panel structure shown in FIG. 9 uses multiple complete sub-pixels in the solid-line frame in FIG. 9 to display a vertical line; as shown in FIG. 9, in this part of the sub-pixels, the first sub-pixel 101 and the second sub-pixel 102 are arranged respectively at two sides of each third sub-pixel 103 used as a visual center, so that the third sub-pixel 103, as well as the adjacent first sub-pixel 101 and second sub-pixel 102, which emit light of different colors, implement color mixing to obtain target white light, thereby improving the display effect of the vertical direction line in a display picture. The vertical direction refers to a direction perpendicular to the first direction X.

Figure 10:
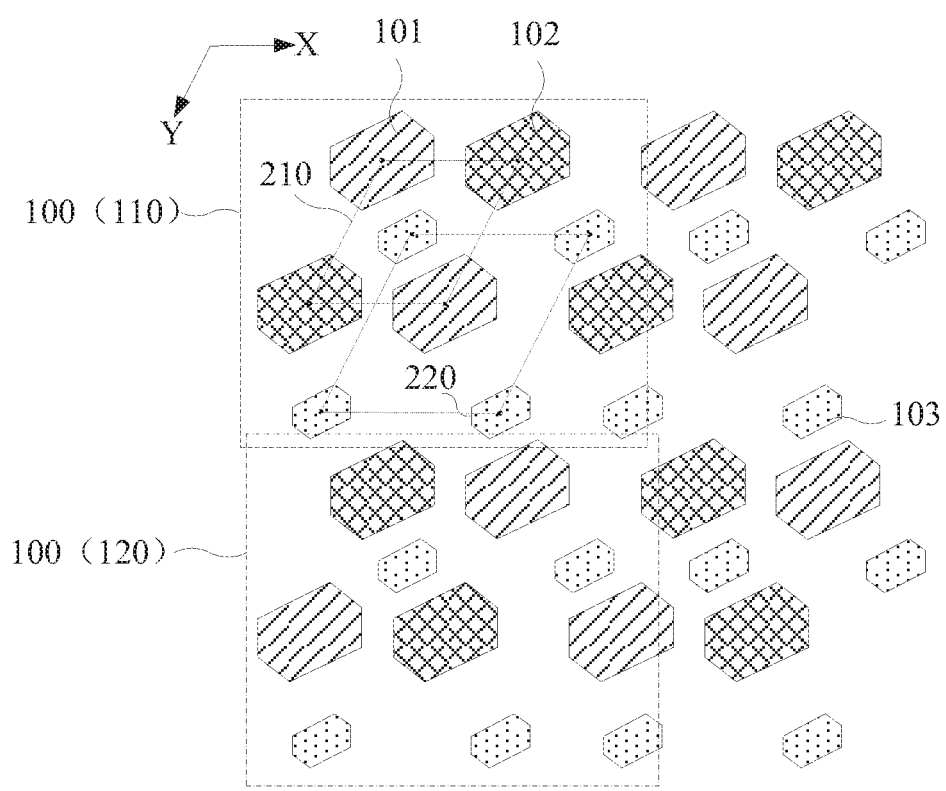
FIG. 10 is a structural diagram of another display panel according to an embodiment of the present disclosure.

FIG. 10 is a structural diagram of another display panel according to an embodiment of the present disclosure. As shown in FIG. 10, in the same pixel unit group 100, the geometric center of the third sub-pixel located inside the first virtual parallelogram 210 coincides with a geometric center of the first virtual parallelogram 210.

It should be noted that, in this arrangement, in the pixel unit group 100, the distance between the third sub-pixel 103 and the first sub-pixel 101 and the distance between the third sub-pixel 103 and the second sub-pixel 102 in a same display pixel unit are closer, and the distances in different display pixel units in the display panel are also closer, which is beneficial to color mixing among the three sub-pixels emitting light of different colors in this display pixel unit.

Figure 11:
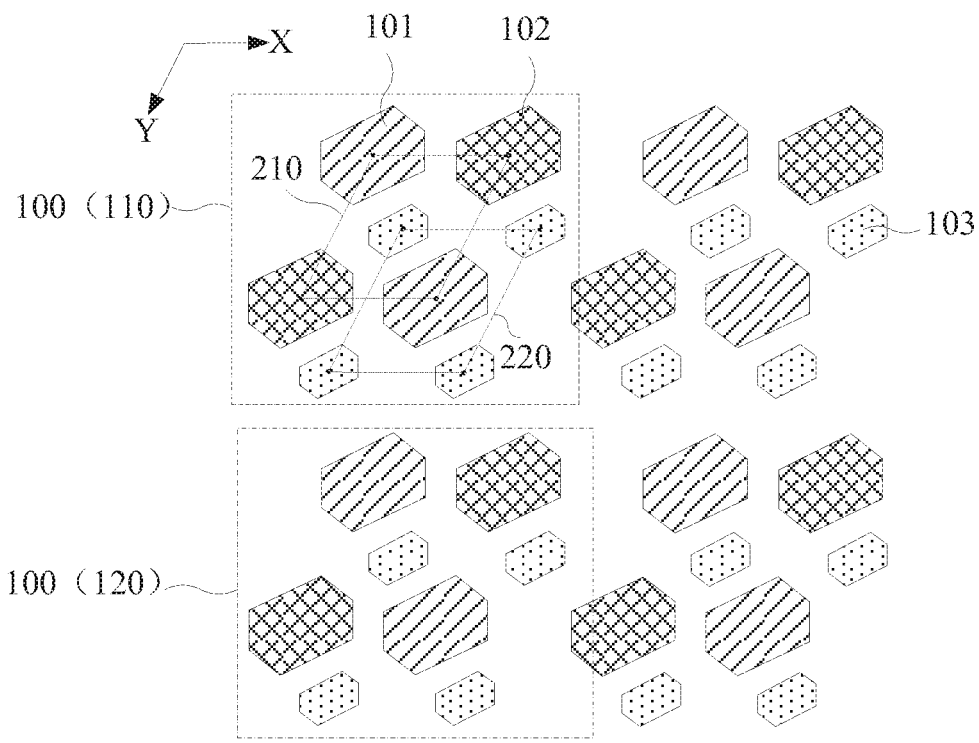
FIG. 11 is a structural diagram of another display panel according to an embodiment of the present disclosure.

FIG. 11 is a structural diagram of another display panel according to an embodiment of the present disclosure. As shown in FIG. 11, in the same pixel unit group 100, a geometric center of the first sub-pixel 101 or the second sub-pixel 102 located inside the second virtual parallelogram 220 coincides with a geometric center of the second virtual parallelogram 220.

It should be noted that, the distance between the third sub-pixel 103 and the first sub-pixel 101 or the second sub-pixel 102 in the display pixel unit is set as a first distance, and this arrangement shown in FIG. 11 can reduce the difference between the first distances for different display pixel units in the pixel unit group 100, which is beneficial to improving the uniformity of emitted light from the display pixel unit, and further improves the quality of the display picture.

Figure 12:
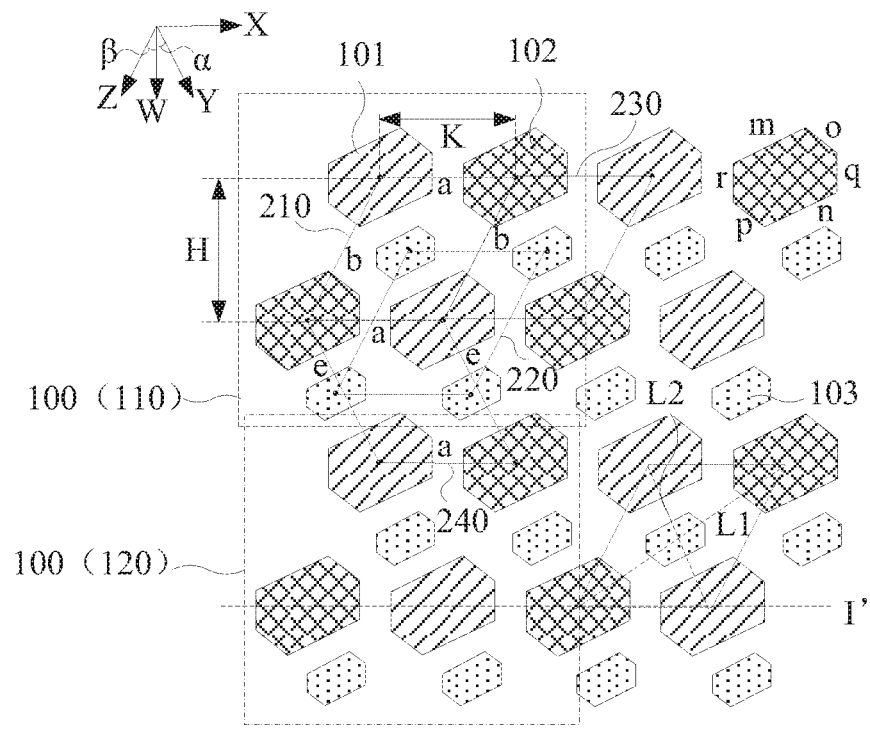
FIG. 12 is a structural diagram of another display panel according to an embodiment of the present disclosure.

FIG. 12 is a structural diagram of another display panel according to an embodiment of the present disclosure. As shown in FIG. 12, along the first direction X, geometric centers of two first sub-pixels 101 and two second sub-pixels 102 on opposite sides of adjacent first virtual parallelograms 210 form a third virtual parallelogram 230, a third sub-pixel 103 is located inside the third virtual parallelogram 230, and a geometric center of the third virtual parallelogram 230 coincides with a geometric center of the third sub-pixel 103 located inside the third virtual parallelogram 230.

Along a direction W perpendicular to the first direction X, geometric centers of two first sub-pixels 101 and two second sub-pixels 102 on opposite sides of adjacent first virtual parallelograms 210 form a fourth virtual parallelogram 240. The fourth virtual parallelogram 240 includes two first sides a extending along the first direction X and two fifth sides e extending along a third direction Z, where a third sub-pixel 103 is disposed on each of the two fifth sides e, the third sub-pixel 103 is located at a center of the corresponding fifth side e, and an included angle between the third direction Z and the direction W perpendicular to the first direction X is equal to an included angle between the second direction Y and the direction W perpendicular to the first direction X.

It should be noted that the display pixel unit in the display panel includes the following two structures: in a first structure, the third sub-pixels emitting light of different colors belong to a same pixel unit group; and in a second structure, one of the three sub-pixels emitting light of different colors belongs to a first pixel unit group, and the other two sub-pixels belong to the second pixel unit group. The structure shown in FIG. 12 can make the distance between the third sub-pixel 103 and the first sub-pixel 101 and the distance between the third sub-pixel 103 and the second sub-pixel 102 in the second display pixel unit close, so as to improve the color mixing effect of the display pixel unit.

Figure 13:
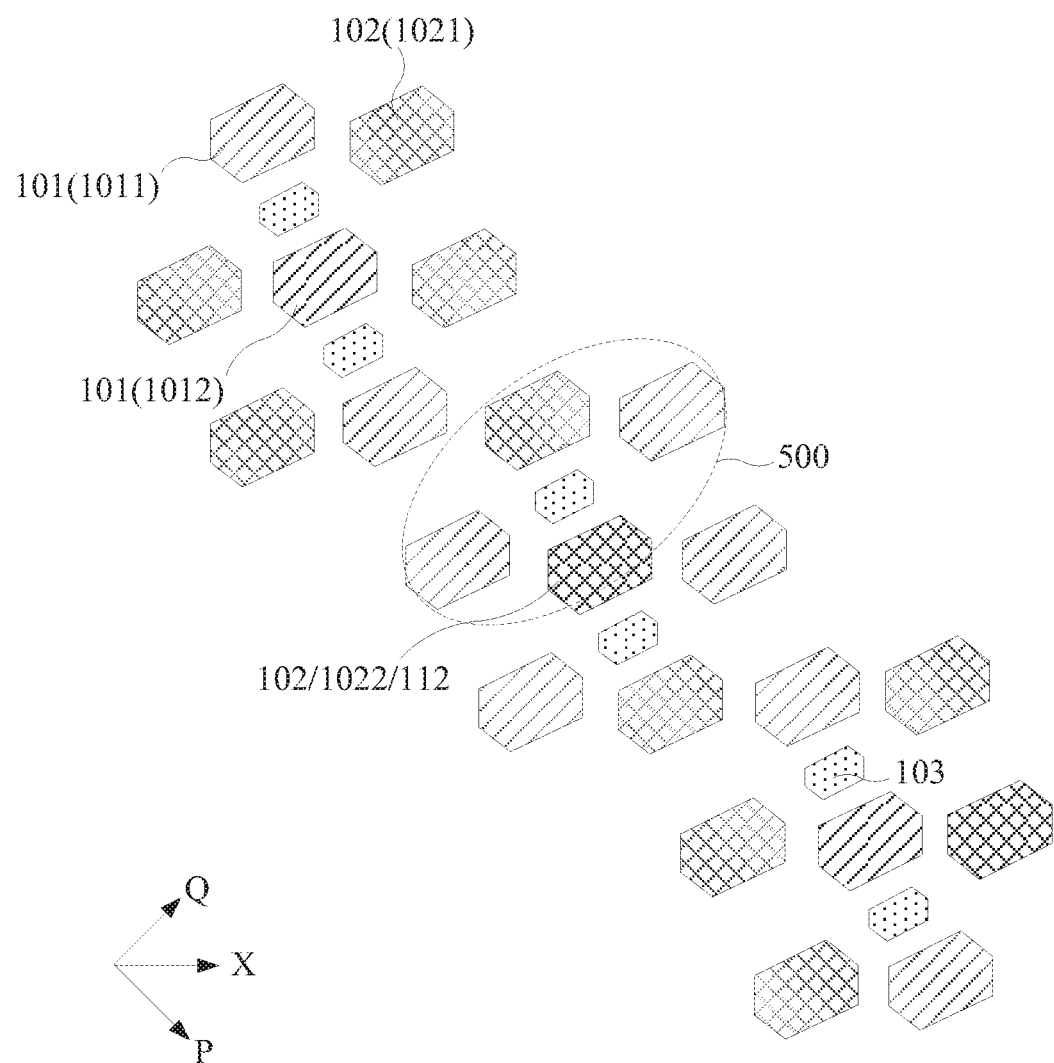
FIG. 13 is a partial structural diagram of a display panel according to an embodiment of the present disclosure.

It should be further noted that, when displaying an image by using a pixel rendering manner, if each third sub-pixel 103 corresponds to one display pixel unit, the pixel array provided by this embodiment displays an oblique line having an included angle of 45° with the first direction X in the structure shown in FIG. 13. As shown in FIG. 13, as the visual center, third sub-pixels 103 are arranged along an extending direction of the oblique line, each third sub-pixel 103, together with two first sub-pixels 101 and two second sub-pixels 102 respectively disposed around the third sub-pixel 103, forms a display unit 500. In the pixel rendering manner provided by this embodiment, if the display panel displays a complete picture, that is, if all sub-pixels are lighted, the third sub-pixels 103 only belong to one display unit 500, while the first sub-pixels 101 and the second sub-pixels 102 each are shared by two display units 500. Therefore, in a single display unit 500, the relative brightness of the third sub-pixel 103 is 1, and the relative brightness of the first sub-pixel 101 and the second sub-pixel 102 is ¼. Therefore, when the oblique line is displayed by using the structure shown in FIG. 13, that is, only the sub-pixels in FIG. 13 are lighted in the display panel, and the relative brightness of the third sub-pixel 103, which is not shared by the two display units 500 is 1, the relative brightness of a beta first sub-pixel 1012 and a beta second sub-pixel 1022 in the same display unit 500 is ½ due to sub-pixel rendering (SPR) algorithm borrowing, and the relative brightness of the alpha first sub-pixel 1011 and the alpha second sub-pixel 1021 shared by the two display units and using the SPR algorithm borrowing is ¼, so that edge brightness of the oblique line is reduced, and the oblique line aliasing is eliminated. The structure shown in FIG. 13 has a smaller width along the direction Q perpendicular to the extending direction P of the oblique line, a width of the gradually reduced dark edge of the oblique line is smaller, edge blur of the displayed oblique line is smaller, and the sharpness is enhanced; meanwhile, a sawtooth phenomenon of the edge can be reduced when displaying the oblique line, thereby enhancing the display performance.

Referring to FIG. 12, the first virtual parallelogram 210 and the third virtual parallelogram 230 are congruent parallelograms, and the first virtual parallelogram 210 and the fourth virtual parallelogram 240, which are adjacently disposed along the direction W perpendicular to the first direction X, are symmetrical about a common side of the first virtual parallelogram 210 and the fourth virtual parallelogram 240, where the common side is a first side a that belongs to the first virtual parallelogram 210 and the fourth virtual parallelogram 240 adjacently disposed.

It should be noted that, this arrangement enables the first sub-pixel 101 and the second sub-pixel 102 to be uniformly distributed, so that the display picture is finer.

With continued reference to FIG. 12, the first virtual parallelogram 210 and the second virtual parallelogram 220 each are congruent parallelograms.

It should be noted that, in this arrangement, on one hand, positions of the sub-pixels corresponding to the first virtual parallelogram 210 and the second virtual parallelogram 220 can be designed to be a same size, which is beneficial to reducing the design difficulty in an early stage, and on the other hand, all the sub-pixels in the pixel unit group 100 are uniformly distributed, which is beneficial to further improving the picture fineness of the display panel.

It should be noted that, compared to the arrangement of the multiple third sub-pixels 103 in a matrix, in the embodiment, the third sub-pixels 103 in adjacent rows are arranged in a staggered manner, and the sub-pixels in a same row are arranged uniformly, so that the third sub-pixels 103 in the display panel have better uniformity, and accordingly, the display effect is improved.

In one or more embodiments, a ratio G of a length of the first side a to a length of the second side b has a value range of $1 < G < 6/5$, and a ratio S of a length of the third side c to a length of the fourth side d has a value range of $1 < S < 6/5$.

It should be noted that the length of each side of the first virtual parallelogram 210 and the second virtual parallelogram 220 is related to a distance between two sub-pixels on that side, and an excessively large difference in length between two adjacent sides in a same virtual parallelogram may cause a decrease in uniformity of distribution of sub-pixels of a corresponding color, thereby affecting the display effect of the display panel.

Exemplarily, G may be $2/\sqrt{5}$, $3/\sqrt{10}$ or $2/\sqrt{17}$.

It should be noted that, in a design process of the display panel, the display panel is divided into multiple square regions arranged in a matrix. Each square region corresponds to one pixel unit, and when a pixel rendering manner is used to implement high PPI display in this embodiment, each pixel unit includes one third sub-pixel 103, half of first sub-pixel 101, and half of second sub-pixel 102. Therefore, in order to adapt the pixel arrangement of the sub-pixels in the square regions to simplify the design difficulty, in an embodiment, a length of a side of any virtual parallelogram extending along the first direction X is equal to the side length of the square region, and the distance between two sides extending along the first direction X is equal to the side length of the square region.

On the other hand, a gradient of the virtual parallelogram is not too large, so as to avoid the case where part of the sub-pixels in the pixel unit extend into the adjacent pixel unit region, which causes disorder in the arrangement of the sub-pixels. Considering the two factors, G may be set to $2/\sqrt{5}$, $3/\sqrt{10}$ or $2/\sqrt{17}$.

As shown in FIG. 12, on the basis of the above embodiment, along the direction W perpendicular to the first direction X, a distance between two first sides a in the first virtual parallelogram 210 is H, and a length of the first sides a is K, where H=K.

It should be noted that, on one hand, a parallelogram with a bottom side equal to a height is convenient for design, and is beneficial to reducing the early design difficulty of the display panel; on the other hand, in the structure shown in FIG. 12, distances from each third sub-pixel 103 to any adjacent third sub-pixels 103 are equal or only slightly different, which is beneficial to the uniform distribution of the third sub-pixels 103 and improves the display effect of the display panel.

Referring to FIG. 12, the first sub-pixel 101, the second sub-pixel 102, and the third sub-pixel 103 each have a shape of an axisymmetric pattern, an extending direction of a symmetry axis of the axisymmetric pattern is the same as an extending direction of a first diagonal L1 in the first virtual parallelogram 210, the first virtual parallelogram 210 includes the first diagonal L1 and a second diagonal L2, and a length of the first diagonal L1 is greater than a length of the second diagonal L2.

It should be noted that, such a design manner can implement effective utilization of gaps between adjacent sub-pixels, which is beneficial to improving an aperture ratio of the display panel.

With continued reference to FIG. 12, the first sub-pixel 101, the second sub-pixel 102 and the third sub-pixel 103 each have a shape of a hexagon, and the hexagon includes an alpha side m, a beta side n, a gamma side o, a delta side p, a epsilon side q, and a zeta side r; the alpha side m and the beta side n are opposite and parallel to each other, the gamma side o and the delta side p are opposite and parallel to each other, and the epsilon side q and the zeta side r are opposite and parallel to each other; extending directions of the alpha side m and the beta side n are parallel to an extending direction of the first diagonal L1; and each of the alpha side m and the beta side n has a length of A, each of the gamma side o, the delta side p, the epsilon side q and the zeta side r has a length of B, and A is greater than B.

It should be noted that, the above-mentioned arrangement can further increase the aperture ratio of the display panel, and reduce an area of contact surface (the opposite surface of the adjacent sub-pixel) of the adjacent sub-pixel, thereby reducing the lateral leakage current in displaying a pure color picture, and reducing the probability of a sneak light phenomenon, especially affecting the sneak light of the red sub-pixel in a pure blue color picture.

It is understood that, in another implementation of this embodiment, the first sub-pixel 101, the second sub-pixel 102, and the third sub-pixel 103 may also have the following shapes: the sub-pixel includes four sides, where two opposite sides are parallel and straight, and each of the other two sides has a shape of an arc facing away from the center of the sub-pixel. At this time, a contact area of the first sub-pixel 101 and the second sub-pixel 102, which are adjacent to each other, is further reduced.

In one or more embodiments, each of the first sub-pixels 101, the second sub-pixels 102 and the third sub-pixels 103 emit light of a red, green and blue color, respectively.

It should be noted that since red, green, and blue are three primary colors of light, and red, green, and blue colors with different intensities may be mixed to obtain light with various colors, each of the first sub-pixels 101, the second sub-pixels 102 and the third sub-pixels 103 is set to emit light of a respective color of red, green and blue, and colors of the first sub-pixel 101, the second sub-pixel 102 and the third sub-pixel 103 are different from each other, so that the display panel displays various colors, and the displayed colors of the display panel are enriched.

Exemplarily, the third sub-pixel 103 may emit green light.

It should be noted that, in the pixel rendering process, each of the first sub-pixels 101 and the sub-pixels 102 in any physical pixel unit is borrowed by another physical pixel unit to form a display pixel unit, so that the first sub-pixel 101 and the second sub-pixel 102 each belong to two display pixel units. Each physical pixel unit includes one third sub-pixel 103, and when the display pixel unit is formed, there is no need to borrow any third sub-pixel 103 of other physical pixel units. Therefore the third sub-pixel 103 belongs to one display pixel unit.

Because human eyes are more sensitive to green, a third color corresponding to the third sub-pixel 103 is set to green, so that human eyes observing the display picture can easily distinguish each display pixel unit, achieving higher visual resolution and a clearer visual picture.

Exemplarily, if the first sub-pixel has an area of P, the second sub-pixel has an area of Q, the third sub-pixel has an area of R, then P>R and Q>R.

It should be noted that, as influenced by material characteristics, if a green sub-pixel, a blue sub-pixel and a red sub-pixel have a same area, the life of the green sub-pixel is longest. Additionally, human eyes are more sensitive to green than red and blue. In order to better mix the red light, the blue light and the green light emitted by the sub-pixels and avoid green color cast, the area of the blue sub-pixel and the area of the red sub-pixel can be set greater than the area of the green sub-pixel, thereby improving the display effect of the display panel on the basis that the life of the green sub-pixel does not limit the life of the display panel.

Figure 14:
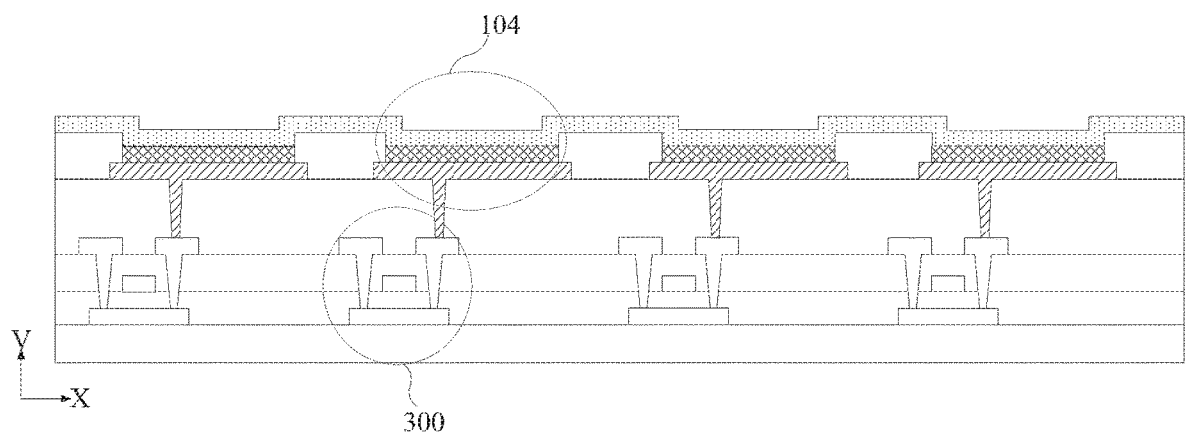
FIG. 14 is a sectional structural view taken along a dotted line I' in FIG. 12.
Figure 15:
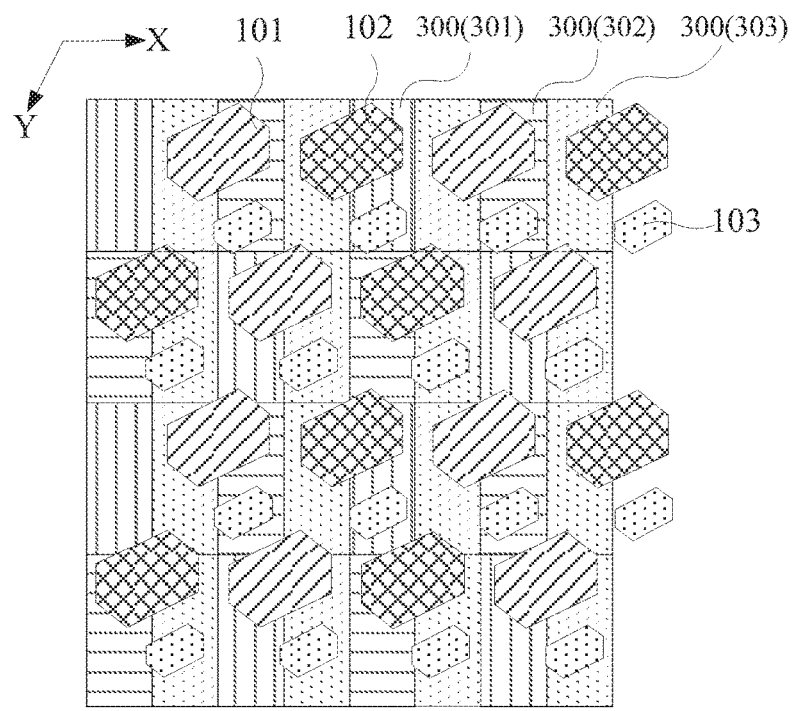
FIG. 15 is a structural diagram of another display panel according to an embodiment of the present disclosure.

FIG. 14 is a sectional structural view taken along a dotted line I' in FIG. 12. FIG. 15 is a structural diagram of another display panel according to an embodiment of the present disclosure. As shown in FIG. 14 and FIG. 15, the display panel further includes multiple pixel circuits 300, the multiple pixel circuits 300 are electrically connected to the sub-pixels 104 in a one-to-one correspondence, and along a light emitting direction of the sub-pixels 104, one or more sub-pixels in the pixel unit group at least partially overlap a correspondingly connected pixel circuit. It should be understood that the sub-pixel 104 may be a first sub-pixel 101, a second sub-pixel 102 or a third sub-pixel 103, and as shown in FIG. 14, four sub-pixels 104 arranged in sequence from left to right are respectively a second sub-pixel 102, a first sub-pixel 101, a second sub-pixel 102 and a first sub-pixel 101.

Exemplarily, as shown in FIG. 15, the multiple pixel units 300 include multiple first pixel units 301, multiple second pixel units 302, and multiple third sub-pixel units 303, where the multiple first pixel units 301 are electrically connected to the first sub-pixels 101 in a one-to-one correspondence, the multiple second pixel units 302 are electrically connected to the third sub-pixels 103 in a one-to-one correspondence, and the multiple third pixel units 303 are electrically connected to the second sub-pixels 102 in a one-to-one correspondence.

It should be noted that, in order to simplify a structure of a drawing, FIG. 14 illustrates a corresponding pixel circuit 300 with a driving transistor, and it is understood that the pixel circuit 300 in the embodiment further includes components other than the driving transistor.

It should be further noted that, along a light emitting direction V of the sub-pixels 104, an arrangement manner in which one or more sub-pixels 104 in the pixel unit group 100 and a correspondingly connected pixel circuit 300 are at least partially overlapped avoids signal delay or loss caused by an excessively large distance between the pixel circuit 300 and the corresponding sub-pixels 104 while ensuring that each sub-pixel 104 may be driven by the corresponding pixel circuit 300, so that the display panel may display properly and have a good display effect.

Figure 16:
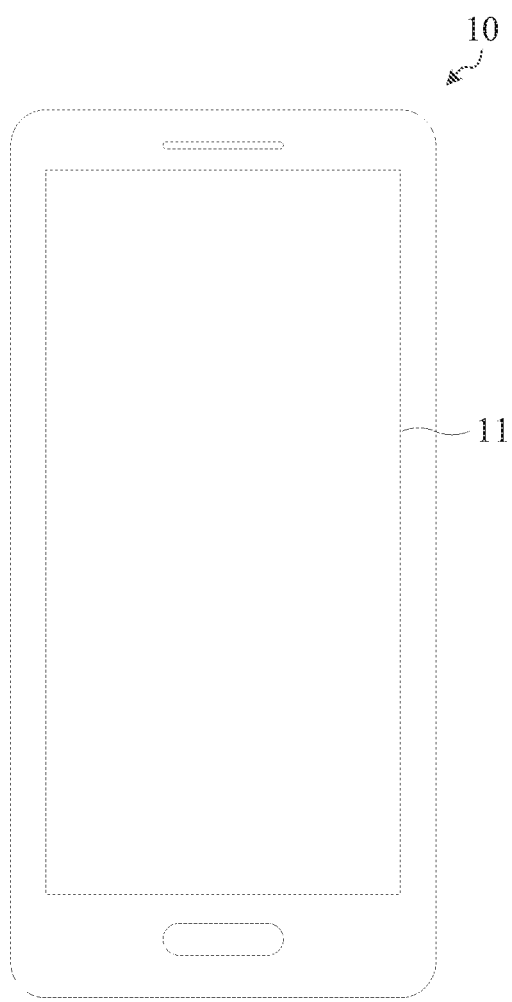
FIG. 16 is a structural diagram of a display device according to an embodiment of the present disclosure.

FIG. 16 is a structural diagram of a display device according to an embodiment of the present disclosure. As shown in FIG. 16, the display device 10 includes the display panel 11 described in any one of the embodiments of the present disclosure. Since the display device 10 provided by this embodiment includes any display panel 11 provided by the embodiments of the present disclosure, the display device 10 has the same or corresponding beneficial effects as the display panel 11 included by the display device 10, and the details are not repeated herein.

It is to be noted that the above are only some embodiments of the present disclosure and the technical principles used therein. It will be understood by those skilled in the art that the present disclosure is not limited to the specific embodiments described herein. Those skilled in the art can make various apparent modifications, adaptations, combinations and substitutions without departing from the scope of the present disclosure. Therefore, while the present disclosure has been described in detail through the above-mentioned embodiments, the present disclosure is not limited to the above-mentioned embodiments and may include additional equivalent embodiments without departing from the concept of the present disclosure. The scope of the present disclosure is determined by the scope of the appended claims.

What is claimed is:

1. A display panel, comprising a plurality of pixel unit groups arranged in a matrix, wherein a row direction of the matrix is a first direction;

wherein each of the plurality of pixel unit groups comprises two first sub-pixels, two second sub-pixels and four third sub-pixels, and the two first sub-pixels, the two second sub-pixels and the four third sub-pixels emit light of different colors;

wherein in a same pixel unit group among the plurality of pixel unit groups, geometric centers of the two first sub-pixels and geometric centers of the two second sub-pixels form a first virtual parallelogram, the first virtual parallelogram comprises two first sides extending along the first direction and two second sides extending along a second direction, the second direction intersects and is not perpendicular to the first direction; and wherein a geometric center of one of the four third sub-pixels is located inside the first virtual parallelogram, other three third sub-pixels of the four third sub-pixels are located outside the first virtual parallelogram, and geometric centers of the four third sub-pixels form a second virtual parallelogram, the second virtual parallelogram comprises two third sides extending along the first direction and two fourth sides extending along the second direction; and wherein along the first direction, geometric centers of two first sub-pixels and two second sub-pixels on opposite sides of adjacent first virtual parallelograms form a third virtual parallelogram, a third sub-pixel is located inside the third virtual parallelogram, and a geometric center of the third virtual parallelogram coincides with a geometric center of the third sub-pixel inside the third virtual parallelogram; and along a direction perpendicular to the first direction, geometric centers of two first sub-pixels and two second sub-pixels on opposite sides of adjacent first virtual parallelograms form a fourth virtual parallelogram, the fourth virtual parallelogram comprises two first sides extending along the first direction and two fifth sides extending along the third direction, wherein a third sub-pixel is disposed on each of the two fifths sides, and the third sub-pixel is located at a center of the corresponding fifth side, and an included angle between the third direction and the direction perpendicular to the first direction is equal to an included angle between the second direction and the direction perpendicular to the first direction.

2. The display panel of claim 1, wherein the plurality of pixel unit groups includes a plurality of first pixel unit groups and a plurality of second pixel unit groups, the plurality of first pixel unit groups is located in an odd row of the matrix and the plurality of second pixel unit groups is located in an even row of the matrix, and each of the plurality of first pixel unit groups and each of the plurality of second pixel unit groups have a same structure.

3. The display panel of claim 1, wherein the plurality of pixel unit groups include a plurality of first pixel unit groups and a plurality of second pixel unit groups, the plurality of first pixel unit groups is located in an odd row of the matrix and the plurality of second pixel unit groups is located in an even row of the matrix, and each of the plurality of first pixel unit groups after positions of the two first sub-pixels and the two second sub-pixels in the each of the plurality of first pixel unit groups are interchanged and each of the plurality of second pixel unit groups have a same structure.

4. The display panel of claim 1, wherein two sub-pixels on a second side of the two second sides emit light of different colors and two sub-pixels on an other second side of the two second sides emit light of different colors.

5. The display panel of claim 1, wherein in the same pixel unit group, the geometric center of the one of the four third sub-pixels located inside the first virtual parallelogram coincides with a geometric center of the first virtual parallelogram.

6. The display panel of claim 1, wherein in the same pixel unit group, a geometric center of one of the two first sub-pixels located inside the second virtual parallelogram or one of the two second sub-pixels located inside the second virtual parallelogram coincides with a geometric center of the second virtual parallelogram.

7. The display panel of claim 1, wherein the first virtual parallelogram and the third virtual parallelogram each are congruent parallelograms; and the first virtual parallelogram and the fourth virtual parallelogram adjacently disposed along the direction perpendicular to the first direction are symmetrical about a common side of the first virtual parallelogram and the fourth virtual parallelogram.

8. The display panel of claim 7, wherein the first virtual parallelogram and the second virtual parallelogram each are congruent parallelograms.

9. The display panel of claim 1, wherein a ratio G of a length of the first side to a length of the third side has a value range of $1 \leq G \leq 6/7$, and a ratio S of a length of the third side to a length of the fourth side has a value range of $1 \leq S \leq 6/7$.

10. The display panel of claim 9, wherein along the direction perpendicular to the first direction, a distance between the two first sides in the first virtual parallelogram is 1-1 and a length of each of the first sides is K, wherein H=K.

11. The display panel of claim 1, wherein the first sub-pixels, the second sub-pixels and the third sub-pixels each emit light of any one color of red, green or blue.

12. The display panel of claim 11, wherein the third sub-pixels emit green light.

13. The display panel of claim 1, wherein each of the first sub-pixels has an area of P, each of the second sub-pixels has an area of Q, each of the third sub-pixels has an area of R, and P>R and Q>R.

14. The display panel of claim 1, further comprising a plurality of pixel circuits, wherein the plurality of pixel circuits is electrically connected to sub-pixels in one-to-one correspondence; and along a light emitting direction of the sub-pixels, at least one sub-pixel in each of the plurality of pixel unit groups at least partially overlap a correspondingly connected pixel circuit.

15. A display panel, comprising a plurality of pixel unit groups arranged in a matrix, wherein a row direction of the matrix is a first direction;
wherein each of the plurality of pixel unit groups comprises two first sub-pixels, two second sub-pixels and four third sub-pixels, and the two first sub-pixels; the two second sub-pixels and the four third sub-pixels emit light of different colors;
wherein in a same pixel unit group among the plurality of pixel unit groups, geometric centers of the two first sub-pixels and geometric centers of the two second sub-pixels form a first virtual parallelogram, the first virtual parallelogram comprises two first sides extending along the first direction and two second sides extending along a second direction, and the second direction intersects and is not perpendicular to the first direction;
wherein a geometric center of one of the four third sub-pixels is located inside the first virtual parallelogram, other three third sub-pixels of the four third sub-pixels are located outside the first virtual parallelogram, and geometric centers of the four third sub-pixels form a second virtual parallelogram, the second virtual parallelogram comprises two third sides extending along the first direction, and two fourth sides extending along the second direction;
wherein the two first sub-pixels, the two second sub-pixels and the four third sub-pixels each have a shape of an axisymmetric pattern, an extending direction of a symmetry axis of the axisymmetric pattern is the same as an extending direction of a first diagonal in the first virtual parallelogram, the first virtual parallelogram comprises the first diagonal and a second diagonal, and a length of the first diagonal is greater than a length of the second diagonal; and
wherein the two first sub-pixels, the two second sub-pixels and the four third sub-pixels each have a shape of a hexagon, and the hexagon comprises an alpha side, a beta side, a gamma side, a delta side, a epsilon side, and a zeta side; the alpha side and the beta side are opposite and parallel to each other, the gamma side and the delta side are opposite and parallel to each other, and the epsilon side and the zeta side are opposite and parallel to each other; extending directions of the alpha side and the beta side are parallel to an extending direction of the first diagonal; and
each of the alpha side and the beta side has a length of A, each of the gamma side, the delta side, the epsilon side and the zeta side has a length of B, and A is greater than B.

16. A display device, comprising a display panel;
wherein the display panel comprises a plurality of pixel unit groups arranged in a matrix,
wherein a row direction of the matrix is a first direction;
wherein each of a plurality of pixel unit groups comprises two first sub-pixels, two second sub-pixels and four third sub-pixels, and the two first sub-pixels, the two second sub-pixels and the four third sub-pixels emit light of different colors;
wherein in a same pixel unit group among the plurality of pixel unit groups, geometric centers of the two first sub-pixels and geometric centers of the two second sub-pixels form a first virtual parallelogram, the first virtual parallelogram comprises two first sides extending along the first direction and two second sides extending along a second direction, the second direction intersects and is not perpendicular to the first direction; and
wherein a geometric center of one of the four third sub-pixels is located inside the first virtual parallelogram, other three third sub-pixels of the four third sub-pixels are located outside the first virtual parallelogram, and geometric centers of the four third sub-pixels form a second virtual parallelogram, the second virtual parallelogram comprises two third sides extending along the first direction and two fourth sides extending along the second direction; and
wherein along the first direction, geometric centers of two first sub-pixels and two second sub-pixels on opposite sides of adjacent first virtual parallelograms form a third virtual parallelogram, a third sub-pixel is located inside the third virtual parallelogram, and a geometric center of the third virtual parallelogram coincides with a geometric center of the third sub-pixel inside the third virtual parallelogram; and
along a direction perpendicular to the first direction, geometric centers of two first sub-pixels and two second sub-pixels on opposite sides of adjacent first virtual parallelograms form a fourth virtual parallelogram, the fourth virtual parallelogram comprises two first sides extending along the first direction and two fifth sides extending along a third direction, wherein a third sub-pixel is disposed on each of the two fifth sides, and the third sub-pixel is located at a center of the corresponding fifth side, and an included angle between the third direction and the direction perpendicular to the first direction is equal to an included angle between the second direction and the direction perpendicular to the first direction.

* * * * *